(12) United States Patent
Zalamea et al.

(10) Patent No.: US 9,493,337 B2
(45) Date of Patent: Nov. 15, 2016

(54) REINFORCED MICROCAPILLARY FILMS AND FOAMS

(75) Inventors: Luis G. Zalamea, Richterswil (CH); Herbert Bongartz, Einsiedeln (CH); Rudolf J. Koopmans, Einsiedeln (CH)

(73) Assignee: Dow Global Technologies LLC, Midland, MI (US)

( * ) Notice: Subject to any disclaimer, the term of this patent is extended or adjusted under 35 U.S.C. 154(b) by 0 days.

(21) Appl. No.: 13/991,442

(22) PCT Filed: Jan. 3, 2012

(86) PCT No.: PCT/US2012/020078
§ 371 (c)(1),
(2), (4) Date: Jun. 4, 2013

(87) PCT Pub. No.: WO2012/094317
PCT Pub. Date: Jul. 12, 2012

(65) Prior Publication Data
US 2014/0072776 A1    Mar. 13, 2014

Related U.S. Application Data

(60) Provisional application No. 61/429,407, filed on Jan. 3, 2011.

(51) Int. Cl.
*B81B 1/00* (2006.01)
*C08J 5/18* (2006.01)
(Continued)

(52) U.S. Cl.
CPC .................. *B81B 1/004* (2013.01); *C08J 5/18* (2013.01); *C08J 9/0085* (2013.01); *C08J 9/35* (2013.01);
(Continued)

(58) Field of Classification Search
CPC ............. B32B 2260/00; B32B 2260/02; B32B 2260/04; B29C 70/16
See application file for complete search history.

(56) References Cited

U.S. PATENT DOCUMENTS 3,503,840 A      3/1970 Parrish et al.
4,592,938 A *    6/1986 Benoit ......................... 428/35.5
(Continued)

FOREIGN PATENT DOCUMENTS

JP    10176310       6/1998
JP    2001018310     1/2001
(Continued)

OTHER PUBLICATIONS

PCT/ US2012/020078, International Search Report, dated Jul. 12, 2012.
(Continued)

*Primary Examiner* — David Sample
*Assistant Examiner* — Donald M Flores, Jr.

(57) ABSTRACT

The instant invention provides reinforced microcapillary films and/or foams. The inventive reinforced film and/or foam have a first end and a second end, wherein the film and/or foam comprises: (a) a matrix comprising a first thermoplastic material, (b) at least one or more channels disposed in parallel in said matrix from the first end to the second end of the film or foam, wherein said one or more channels are at least 1 μm apart from each other, and wherein each said one or more channels have a diameter in the range of at least 1 μm; and (c) a second thermoplastic material disposed in said one or more channels, wherein said second thermoplastic material is different than the first thermoplastic material; wherein said film has a thickness in the range of from 2 μm to 2000 μm.

7 Claims, 10 Drawing Sheets

(51) Int. Cl.
*C08J 9/00* (2006.01)
*C08J 9/35* (2006.01)
*C08L 23/08* (2006.01)
*C08L 23/12* (2006.01)

(52) U.S. Cl.
CPC ............ *C08L 23/0815* (2013.01); *C08L 23/12* (2013.01); *Y10T 428/24744* (2015.01)

(56) References Cited

U.S. PATENT DOCUMENTS

| | | | |
|---|---|---|---|
| 4,999,384 A * | 3/1991 | Roberts ................. | C08J 9/0061 521/134 |
| 5,504,172 A | 4/1996 | Imuta et al. | |
| 6,103,152 A * | 8/2000 | Gehlsen et al. ........... | 428/317.9 |
| 6,525,157 B2 | 2/2003 | Cozewith et al. | |
| 6,872,343 B2 | 3/2005 | Edwards et al. | |
| 6,960,635 B2 | 11/2005 | Stevens et al. | |
| 6,995,099 B1 * | 2/2006 | Nishimura et al. ........... | 428/113 |
| 8,420,760 B2 | 4/2013 | Hughes et al. | |
| 2006/0199930 A1 | 9/2006 | Shan et al. | |
| 2008/0044659 A1 * | 2/2008 | Pilpel .......................... | 428/411.1 |
| 2008/0197518 A1 * | 8/2008 | Aylward et al. ............. | 264/1.34 |
| 2009/0011182 A1 * | 1/2009 | Mackley .............. | B01D 63/066 428/119 |
| 2010/0121463 A1 * | 5/2010 | Tormala et al. ........... | 623/23.75 |
| 2013/0101762 A1 * | 4/2013 | Malis et al. ................ | 428/411.1 |

FOREIGN PATENT DOCUMENTS

| WO | 9737874 | 10/1997 |
|---|---|---|
| WO | 00/01745 A1 | 1/2000 |
| WO | 2005056272 | 6/2005 |
| WO | 2005/090427 A1 | 9/2005 |

OTHER PUBLICATIONS

PCT/ US2012/020078, International Preliminary Report on Patentability, dated Jul. 10, 2013.
PCT/ US2012/020078, Written Opinion of the International Searching Authority, dated Jul. 3, 2013.
Chinese Office Action for counterpart Chinese Application No. 201280009771.6, 3 pages.
Japanese Office Action dated Aug. 25, 2015 for Japanese Application No. 2013-547724, 6 pages.
EP Office Action dated Nov. 13, 2015; from EP counterpart Application No. 12706720.5.
Japanese Office Action dated Aug. 25, 2015 for Japanese Application No. 2013-547724, 1 page.
Chinese Response to Office Action May 21, 2015; from Chinese counterpart Application No. 201280009771.6.
Chinese Office Action dated Nov. 6, 2015; from Chinese counterpart Application No. 201280009771.6.
Chinese Response to Office Action dated Dec. 17, 2015; from Chinese counterpart Application No. 201280009771.6.
EP Response to Office Action dated Mar. 2, 2016; from EP counterpart Application No. 12706720.5.
Japanese Office Action dated Mar. 22, 2016; from Japanese counterpart Application No. 2013-547724.
Chinese Office Action dated Apr. 19, 2016; from Chinese counterpart Application No. 201280009771.6.

* cited by examiner

FIG. 1
FIG. 2
FIG. 3
FIG. 4
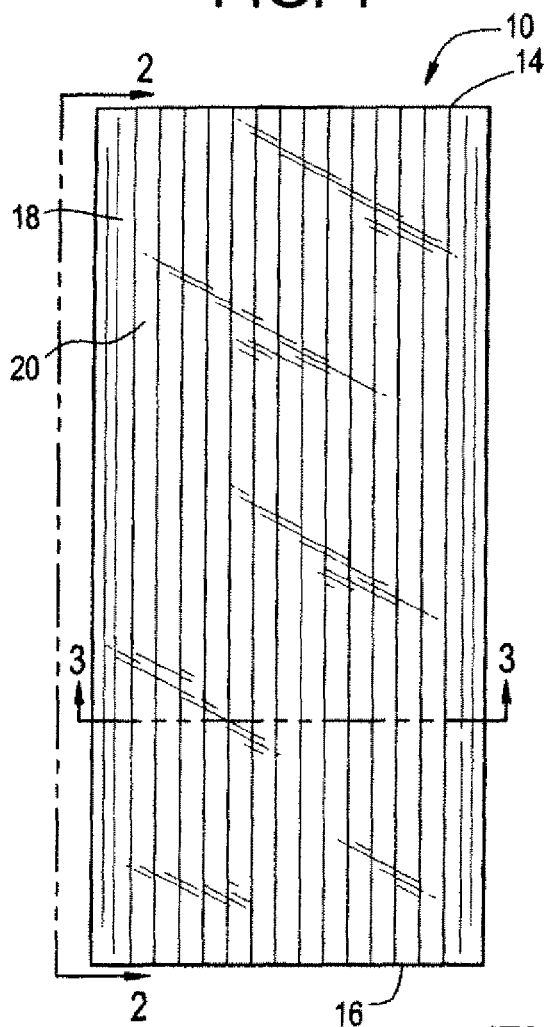
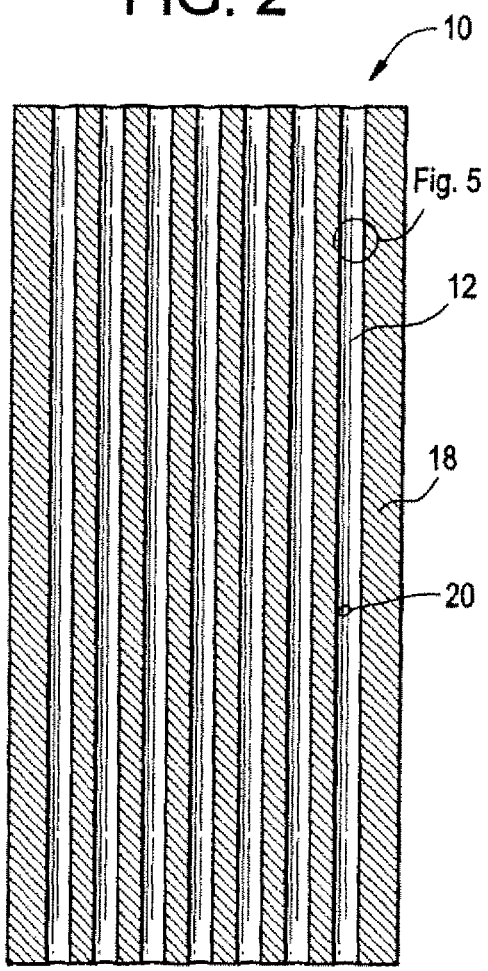
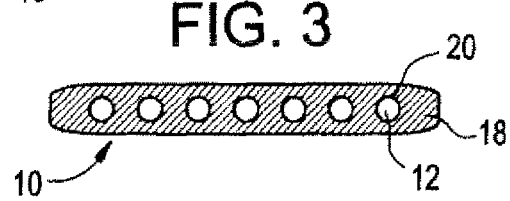
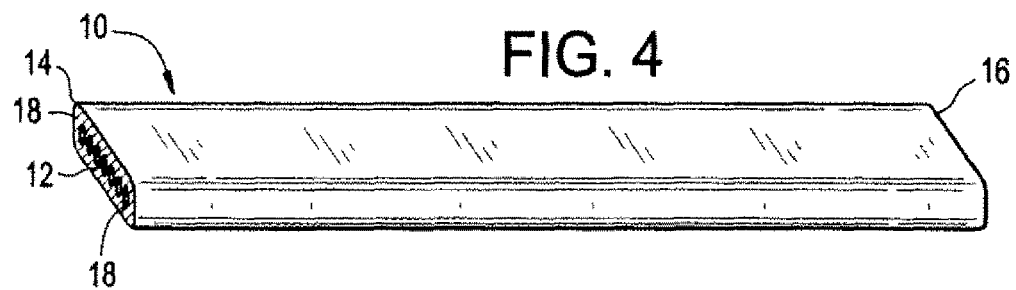

Inventive reinforced film 1 (Initial End)

Inventive reinforced film 1 (Terminal End)

Inventive reinforced film 2 (Initial End)

Inventive reinforced film 2 (Middle)

Inventive reinforced film 2 (Terminal End)

Comparative film A (Initial End)

Comparative film A (Terminal End)

Comparative film B (Initial End)

Comparative film C (Initial End)

Comparative film C (Middle)

Comparative film C (Terminal End)

REINFORCED MICROCAPILLARY FILMS AND FOAMS

FIELD OF INVENTION

The instant invention relates to reinforced microcapillary films and foams.

BACKGROUND OF THE INVENTION

The use of fibrous materials to improve mechanical properties of polymeric films and/or foams is generally known. Furthermore, it is generally known as the length of these fibrous material incorporated into the polymeric films and/or foams increases, such mechanical properties also improve. The use of pultrusion process to incorporated glass or carbon fiber into polymeric materials thereby reinforcing such polymeric materials is also generally known. However, the current available technologies fail to meet all of the required mechanical properties in a variety of end-use applications.

Accordingly, despite the research efforts in reinforcing such polymeric materials, there is still a need for reinforced microcapillary films and/or foams with improved mechanical properties.

SUMMARY OF THE INVENTION

The instant invention provides reinforced microcapillary films and/or foams. The inventive reinforced film and/or foam have a first end and a second end, wherein the film and/or foam comprises: (a) a matrix comprising a first thermoplastic material, (b) at least one or more channels disposed in parallel in said matrix from the first end to the second end of the film and/or foam, wherein said one or more channels are at least 1 µm apart from each other, and wherein each said one or more channels have a diameter in the range of at least 1 µm; and (c) a second thermoplastic material disposed in said one or more channels, wherein said second thermoplastic material is different than the first thermoplastic material; wherein said film has a thickness in the range of from 2 µm to 2000 µm.

In an alternative embodiment, the instant invention provides reinforced microcapillary films and/or foams, in accordance with any of the preceding embodiments, except that the first thermoplastic material is selected from the group consisting of polyolefin; polyamide; polyvinylidene chloride; polyvinylidene fluoride; polycarbonate; polystyrene; polyethylene vinyl alcohol (PVOH), polyvinyl chloride (PVC), polylactic acid (PLA) and polyethylene terephthalate.

In an alternative embodiment, the instant invention provides reinforced microcapillary films and/or foams, in accordance with any of the preceding embodiments, except that the one or more channels have a cross-sectional shape selected from the group consisting of circular, rectangular, oval, star, diamond, triangular, square, the like, and combinations thereof.

In an alternative embodiment, the instant invention provides reinforced microcapillary films and/or foams, in accordance with any of the preceding embodiments, except that the second thermoplastic material is selected from the group consisting of polyolefin; polyamide; polyvinylidene chloride; polyvinylidene fluoride; polycarbonate; polystyrene; polyethylene vinyl alcohol (PVOH), polyvinyl chloride (PVC), polylactic acid (PLA) and polyethylene terephthalate.

In an alternative embodiment, the instant invention provides a multilayer structure comprising the reinforced microcapillary films and/or foams, in accordance with any of the preceding embodiments.

In an alternative embodiment, the instant invention provides an article comprising the reinforced microcapillary films and/or foams, in accordance with any of the preceding embodiments.

BRIEF DESCRIPTION OF THE DRAWINGS

For the purpose of illustrating the invention, there is shown in the drawings a form that is exemplary; it being understood, however, that this invention is not limited to the precise arrangements and instrumentalities shown.

FIG. 1 is a top view of an inventive reinforced microcapillary film and/or foam;

FIG. 2 is a longitudinal-sectional view of an inventive reinforced microcapillary film and/or foam;

FIG. 3 are various cross-sectional views of an inventive reinforced microcapillary film and/or foam;

FIG. 4 is an elevated view of an inventive reinforced microcapillary film and/or foam;

DETAILED DESCRIPTION OF THE INVENTION

Figure 5:
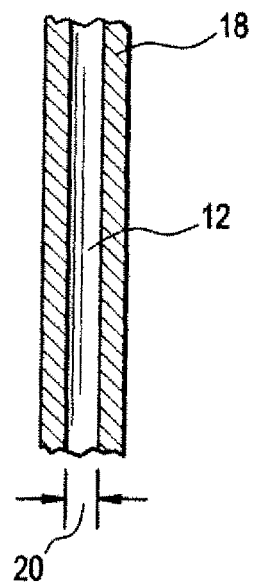
FIG. 5 is a segment of a longitudinal sectional view of the inventive microcapillary reinforced microcapillary film and/or foam, as shown in FIG. 2.
Figure 6:
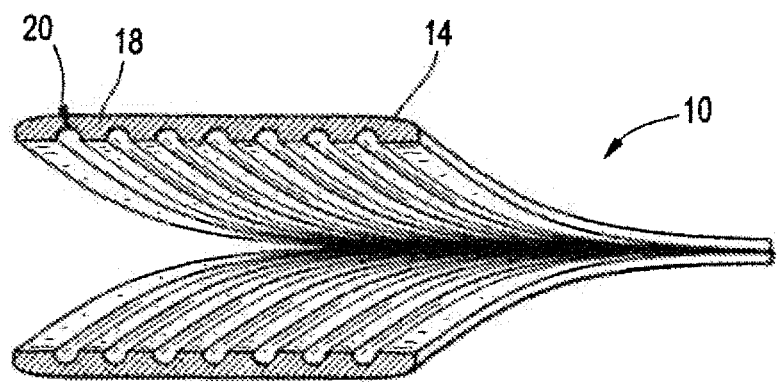
FIG. 6 is an exploded view of an inventive reinforced microcapillary film and/or foam.

Referring to the drawings wherein like numerals indicate like elements, there is shown, in FIGS. 1-6, a first embodiment of a reinforced microcapillary film and/or foam (10).

The inventive reinforced microcapillary film or foam (10) according to the present invention has a first end (14) and a second end (16), and comprises: (a) a matrix (18) comprising a first thermoplastic material (11); (b) at least one or more channels (20) are disposed in parallel in the matrix (18) from the first end (14) to the second end (16) of the reinforced microcapillary film or foam (10), wherein the one or more channels (20) are at least 1 µm apart from each other, and wherein each of the one or more channels (20) has a diameter in the range of at least 1 µm; and (c) a second thermoplastic material (12) disposed in the one or more channels (20), wherein the second thermoplastic material (12) is different than the first thermoplastic material (11); and wherein said reinforced microcapillary film or foam (10) has a thickness in the range of from 2 µm to 2000 µm.

The reinforced microcapillary film or foam (10) may have a thickness in the range of from 2 µm to 2000 µm; for example, reinforced microcapillary film or foam (10) may have a thickness in the range of from 10 to 2000 µm; or in the alternative, from 100 to 1000 µm; or in the alternative, from 200 to 800 µm; or in the alternative, from 200 to 600 µm; or in the alternative, from 300 to 1000 µm; or in the alternative, from 300 to 900 µm; or in the alternative, from 300 to 700 µm. The film thickness to microcapillary diameter ratio is in the range of from 2:1 to 400:1.

The reinforced microcapillary film or foam (10) may comprise at least 10 percent by volume of the matrix (18), based on the total volume of the reinforced microcapillary film or foam (10); for example, the reinforced microcapillary film or foam (10) may comprise from 10 to 80 percent by volume of the matrix (18), based on the total volume of the reinforced microcapillary film or foam (10); or in the alternative, from 20 to 80 percent by volume of the matrix (18), based on the total volume of the reinforced microcapillary film or foam (10); or in the alternative, from 30 to 80 percent by volume of the matrix (18), based on the total volume of the reinforced microcapillary film or foam (10).

The reinforced microcapillary film or foam (10) may comprise from 20 to 90 percent by volume of voidage, based on the total volume of the reinforced microcapillary film or foam (10); for example, the reinforced microcapillary film or foam (10) may comprise from 20 to 80 percent by volume of voidage, based on the total volume of the reinforced microcapillary film or foam (10); or in the alternative, from 20 to 70 percent by volume of voidage, based on the total volume of the reinforced microcapillary film or foam (10); or in the alternative, from 30 to 60 percent by volume of voidage, based on the total volume of the reinforced microcapillary film or foam (10).

The reinforced microcapillary film or foam (10) may comprise from 50 to 100 percent by volume of the second thermoplastic material (12), based on the total voidage volume, described above; for example, the reinforced microcapillary film or foam (10) may comprise from 60 to 100 percent by volume of the second thermoplastic material (12), based on the total voidage volume, described above; or in the alternative, from 70 to 100 percent by volume of the second thermoplastic material (12), based on the total voidage volume, described above; or in the alternative, from 80 to 100 percent by volume of the second thermoplastic material (12), based on the total voidage volume, described above.

The inventive reinforced microcapillary film or foam (10) has a first end (14) and a second end (16). At least one or more channels (20) are disposed in parallel in the matrix (18) from the first end (14) to the second end (16). The one or more channels (20) are at least 1 µm apart from each other. The one or more channels (20) have a diameter in the range of at least 1 µm; for example, from 2 µm to 1998 µm; or in the alternative, from 5 to 990 µm; or in the alternative, from 5 to 890 µm; or in the alternative, from 5 to 790 µm; or in the alternative, from 5 to 690 µm or in the alternative, from 5 to 590 µm. The one or more channels (20) may have a cross sectional shape selected from the group consisting of circular, rectangular, oval, star, diamond, triangular, square, the like, and combinations thereof. The one or more channels (20) may further include one or more seals at the first end (14), the second end (16), therebetween the first point (14) and the second end (16), and/or combinations thereof.

The matrix (18) comprises one or more first thermoplastic material (11). Such first thermoplastic materials (11) include, but are not limited to, polyolefin, e.g. polyethylene and polypropylene; polyamide, e.g. nylon 6; polyvinylidene chloride; polyvinylidene fluoride; polycarbonate; polystyrene; polyethylene terephthalate; polyurethane and polyester. The matrix (18) may be reinforced via, for example, glass or carbon fibers and/or any other mineral fillers such talc or calcium carbonate. Exemplary fillers include, but are not limited to, natural calcium carbonates, including chalks, calcites and marbles, synthetic carbonates, salts of magnesium and calcium, dolomites, magnesium carbonate, zinc carbonate, lime, magnesia, barium sulphate, barite, calcium sulphate, silica, magnesium silicates, talc, wollastonite, clays and aluminum silicates, kaolins, mica, oxides or hydroxides of metals or alkaline earths, magnesium hydroxide, iron oxides, zinc oxide, glass or carbon fiber or powder, wood fiber or powder or mixtures of these compounds.

Examples of first thermoplastic materials (11) include, but are not limited to, homopolymers and copolymers (including elastomers) of one or more alpha-olefins such as ethylene, propylene, 1-butene, 3-methyl-1-butene, 4-methyl-1-pentene, 3-methyl-1-pentene, 1-heptene, 1-hexene, 1-octene, 1-decene, and 1-dodecene, as typically represented by polyethylene, polypropylene, poly-1-butene, poly-3-methyl-1-butene, poly-3-methyl-1-pentene, poly-4-methyl-1-pentene, ethylene-propylene copolymer, ethylene-1-butene copolymer, and propylene-1-butene copolymer; copolymers (including elastomers) of an alpha-olefin with a conjugated or non-conjugated diene, as typically represented by ethylene-butadiene copolymer and ethylene-ethylidene norbornene copolymer; and polyolefins (including elastomers) such as copolymers of two or more alpha-olefins with a conjugated or non-conjugated diene, as typically represented by ethylene-propylene-butadiene copolymer, ethylene-propylene-dicyclopentadiene copolymer, ethylene-propylene-1,5-hexadiene copolymer, and ethylene-propylene-ethylidene norbornene copolymer; ethylene-vinyl compound copolymers such as ethylene-vinyl acetate copolymer, ethylene-vinyl alcohol copolymer, ethylene-vinyl chloride copolymer, ethylene acrylic acid or ethylene-(meth)acrylic acid copolymers, and ethylene-(meth)acrylate copolymer; styrenic copolymers (including elastomers) such as polystyrene, ABS, acrylonitrile-styrene copolymer, α-methylstyrene-styrene copolymer, styrene vinyl alcohol, styrene acrylates such as styrene methylacrylate, styrene butyl acrylate, styrene butyl methacrylate, and styrene butadienes and crosslinked styrene polymers; and styrene block copolymers (including elastomers) such as styrene-butadiene copolymer and hydrate thereof, and styrene-isoprene-styrene triblock copolymer; polyvinyl compounds such as polyvinyl chloride, polyvinylidene chloride, vinyl chloride-vinylidene chloride copolymer, polyvinylidene fluoride, polymethyl acrylate, and polymethyl methacrylate; polyamides such as nylon 6, nylon 6,6, and nylon 12; thermoplastic polyesters such as polyethylene terephthalate and polybutylene terephthalate; polyurethane, polycarbonate, polyphenylene oxide, and the like; and glassy hydrocarbon-based resins, including poly-dicyclopentadiene polymers and related polymers (copolymers, terpolymers); saturated mono-olefins such as vinyl acetate, vinyl propionate, vinyl versatate, and vinyl butyrate and the like; vinyl esters such as esters of monocarboxylic acids, including methyl acrylate, ethyl acrylate, n-butyl acrylate, isobutyl acrylate, 2-ethylhexyl acrylate, dodecyl acrylate, n-octyl acrylate, phenyl acrylate, methyl methacrylate, ethyl methacrylate, and butyl methacrylate and the like; acrylonitrile, methacrylonitrile, acrylamide, mixtures thereof; resins produced by ring opening metathesis and cross metathesis polymerization and the like. These resins may be used either alone or in combinations of two or more.

In selected embodiments, first thermoplastic materials (11) may, for example, comprise one or more polyolefins selected from the group consisting of ethylene-alpha olefin copolymers, propylene-alpha olefin copolymers, and olefin block copolymers. In particular, in select embodiments, the first thermoplastic materials (11) may comprise one or more non-polar polyolefins.

In specific embodiments, polyolefins such as polypropylene, polyethylene, copolymers thereof, and blends thereof, as well as ethylene-propylene-diene terpolymers, may be used. In some embodiments, exemplary olefinic polymers include homogeneous polymers; high density polyethylene (HDPE); heterogeneously branched linear low density polyethylene (LLDPE); heterogeneously branched ultra low linear density polyethylene (ULDPE); homogeneously branched, linear ethylene/alpha-olefin copolymers; homogeneously branched, substantially linear ethylene/alpha-olefin polymers; and high pressure, free radical polymerized ethylene polymers and copolymers such as low density polyethylene (LDPE) or ethylene vinyl acetate polymers (EVA).

In one embodiment, the ethylene-alpha olefin copolymer may, for example, be ethylene-butene, ethylene-hexene, or ethylene-octene copolymers or interpolymers. In other particular embodiments, the propylene-alpha olefin copolymer may, for example, be a propylene-ethylene or a propylene-ethylene-butene copolymer or interpolymer.

In certain other embodiments, the first thermoplastic materials (11) may, for example, be a semi-crystalline polymer and may have a melting point of less than 110° C. In another embodiment, the melting point may be from 25 to 100° C. In another embodiment, the melting point may be between 40 and 85° C.

In one particular embodiment, the first thermoplastic materials (11) is a propylene/α-olefin interpolymer composition comprising a propylene/alpha-olefin copolymer, and optionally one or more polymers, e.g. a random copolymer polypropylene (RCP). In one particular embodiment, the propylene/alpha-olefin copolymer is characterized as having substantially isotactic propylene sequences. "Substantially isotactic propylene sequences" means that the sequences have an isotactic triad (mm) measured by $^{13}$C NMR of greater than about 0.85; in the alternative, greater than about 0.90; in another alternative, greater than about 0.92; and in another alternative, greater than about 0.93. Isotactic triads are well-known in the art and are described in, for example, U.S. Pat. No. 5,504,172 and International Publication No. WO 00/01745, which refer to the isotactic sequence in terms of a triad unit in the copolymer molecular chain determined by $^{13}$C NMR spectra.

The propylene/alpha-olefin copolymer may have a melt flow rate in the range of from 0.1 to 500 g/10 minutes, measured in accordance with ASTM D-1238 (at 230° C./2.16 Kg). All individual values and subranges from 0.1 to 500 g/10 minutes are included herein and disclosed herein; for example, the melt flow rate can be from a lower limit of 0.1 g/10 minutes, 0.2 g/10 minutes, or 0.5 g/10 minutes to an upper limit of 500 g/10 minutes, 200 g/10 minutes, 100 g/10 minutes, or 25 g/10 minutes. For example, the propylene/alpha-olefin copolymer may have a melt flow rate in the range of from 0.1 to 200 g/10 minutes; or in the alternative, the propylene/alpha-olefin copolymer may have a melt flow rate in the range of from 0.2 to 100 g/10 minutes; or in the alternative, the propylene/alpha-olefin copolymer may have a melt flow rate in the range of from 0.2 to 50 g/10 minutes; or in the alternative, the propylene/alpha-olefin copolymer may have a melt flow rate in the range of from 0.5 to 50 g/10 minutes; or in the alternative, the propylene/alpha-olefin copolymer may have a melt flow rate in the range of from 1 to 50 g/10 minutes; or in the alternative, the propylene/alpha-olefin copolymer may have a melt flow rate in the range of from 1 to 40 g/10 minutes; or in the alternative, the propylene/alpha-olefin copolymer may have a melt flow rate in the range of from 1 to 30 g/10 minutes.

The propylene/alpha-olefin copolymer has a crystallinity in the range of from at least 1 percent by weight (a heat of fusion of at least 2 Joules/gram) to 30 percent by weight (a heat of fusion of less than 50 Joules/gram). All individual values and subranges from 1 percent by weight (a heat of fusion of at least 2 Joules/gram) to 30 percent by weight (a heat of fusion of less than 50 Joules/gram) are included herein and disclosed herein; for example, the crystallinity can be from a lower limit of 1 percent by weight (a heat of fusion of at least 2 Joules/gram), 2.5 percent (a heat of fusion of at least 4 Joules/gram), or 3 percent (a heat of fusion of at least 5 Joules/gram) to an upper limit of 30 percent by weight (a heat of fusion of less than 50 Joules/gram), 24 percent by weight (a heat of fusion of less than 40 Joules/gram), 15 percent by weight (a heat of fusion of less than 24.8 Joules/gram) or 7 percent by weight (a heat of fusion of less than 11 Joules/gram). For example, the propylene/alpha-olefin copolymer may have a crystallinity in the range of from at least 1 percent by weight (a heat of fusion of at least 2 Joules/gram) to 24 percent by weight (a heat of fusion of less than 40 Joules/gram); or in the alternative, the propylene/alpha-olefin copolymer may have a crystallinity in the range of from at least 1 percent by weight (a heat of fusion of at least 2 Joules/gram) to 15 percent by weight (a heat of fusion of less than 24.8 Joules/gram); or in the alternative, the propylene/alpha-olefin copolymer may have a crystallinity in the range of from at least 1 percent by weight (a heat of fusion of at least 2 Joules/gram) to 7 percent by weight (a heat of fusion of less than 11 Joules/gram); or in the alternative, the propylene/alpha-olefin copolymer may have a crystallinity in the range of from at least 1 percent by weight (a heat of fusion of at least 2 Joules/gram) to 5 percent by weight (a heat of fusion of less than 8.3 Joules/gram). The crystallinity is measured via DSC method. The propylene/alpha-olefin copolymer comprises units derived from propylene and polymeric units derived from one or more alpha-olefin comonomers. Exemplary comonomers utilized to manufacture the propylene/alpha-olefin copolymer are $C_2$, and $C_4$ to $C_{10}$ alpha-olefins; for example, $C_2$, $C_4$, $C_6$ and $C_8$ alpha-olefins.

The propylene/alpha-olefin copolymer comprises from 1 to 40 percent by weight of one or more alpha-olefin comonomers. All individual values and subranges from 1 to 40 weight percent are included herein and disclosed herein; for example, the comonomer content can be from a lower limit of 1 weight percent, 3 weight percent, 4 weight percent, 5 weight percent, 7 weight percent, or 9 weight percent to an upper limit of 40 weight percent, 35 weight percent, 30 weight percent, 27 weight percent, 20 weight percent, 15 weight percent, 12 weight percent, or 9 weight percent. For example, the propylene/alpha-olefin copolymer comprises from 1 to 35 percent by weight of one or more alpha-olefin comonomers; or in the alternative, the propylene/alpha-olefin copolymer comprises from 1 to 30 percent by weight of one or more alpha-olefin comonomers; or in the alternative, the propylene/alpha-olefin copolymer comprises from 3 to 27 percent by weight of one or more alpha-olefin comonomers; or in the alternative, the propylene/alpha-olefin copolymer comprises from 3 to 20 percent by weight of one or more alpha-olefin comonomers; or in the alternative, the propylene/alpha-olefin copolymer comprises from 3 to 15 percent by weight of one or more alpha-olefin comonomers.

The propylene/alpha-olefin copolymer has a molecular weight distribution (MWD), defined as weight average molecular weight divided by number average molecular weight ($M_w/M_n$) of 3.5 or less; in the alternative 3.0 or less; or in another alternative from 1.8 to 3.0.

Such propylene/alpha-olefin copolymers are further described in details in the U.S. Pat. Nos. 6,960,635 and 6,525,157, incorporated herein by reference. Such propylene/alpha-olefin copolymers are commercially available from The Dow Chemical Company, under the tradename VERSIFY™, or from ExxonMobil Chemical Company, under the tradename VISTAMAXX™.

In one embodiment, the propylene/alpha-olefin copolymers are further characterized as comprising (A) between 60 and less than 100, preferably between 80 and 99 and more preferably between 85 and 99, weight percent units derived from propylene, and (B) between greater than zero and 40, preferably between 1 and 20, more preferably between 4 and 16 and even more preferably between 4 and 15, weight percent units derived from at least one of ethylene and/or a $C_{4-10}$ α-olefin; and containing an average of at least 0.001, preferably an average of at least 0.005 and more preferably an average of at least 0.01, long chain branches/1000 total carbons. The maximum number of long chain branches in the propylene/alpha-olefin copolymer is not critical, but typically it does not exceed 3 long chain branches/1000 total carbons. The term long chain branch, as used herein with regard to propylene/alpha-olefin copolymers, refers to a chain length of at least one (1) carbon more than a short chain branch, and short chain branch, as used herein with regard to propylene/alpha-olefin copolymers, refers to a chain length of two (2) carbons less than the number of carbons in the comonomer. For example, a propylene/1-octene interpolymer has backbones with long chain branches of at least seven (7) carbons in length, but these backbones also have short chain branches of only six (6) carbons in length. Such propylene/alpha-olefin copolymers are further described in details in the U.S. Provisional Patent Application No. 60/988,999 and International Patent Application No. PCT/US08/082599, each of which is incorporated herein by reference.

In certain other embodiments, the first thermoplastic material 11, e.g. propylene/alpha-olefin copolymer, may, for example, be a semi-crystalline polymer and may have a melting point of less than 110° C. In preferred embodiments, the melting point may be from 25 to 100° C. In more preferred embodiments, the melting point may be between 40 and 85° C.

In other selected embodiments, olefin block copolymers, e.g., ethylene multi-block copolymer, such as those described in the International Publication No. WO2005/090427 and U.S. Patent Application Publication No. US 2006/0199930, incorporated herein by reference to the extent describing such olefin block copolymers and the test methods for measuring those properties listed below for such polymers, may be used as the first thermoplastic materials (11). Such olefin block copolymer may be an ethylene/α-olefin interpolymer:

(a) having a $M_w/M_n$ from about 1.7 to about 3.5, at least one melting point, $T_m$, in degrees Celsius, and a density, d, in grams/cubic centimeter, wherein the numerical values of $T_m$ and d corresponding to the relationship:

$$T_m > -2002.9 + 4538.5(d) - 2422.2(d)^2; \text{ or}$$

(b) having a $M_w/M_n$ from about 1.7 to about 3.5, and being characterized by a heat of fusion, ΔH in J/g, and a delta quantity, ΔT, in degrees Celsius defined as the temperature difference between the tallest DSC peak and the tallest CRYSTAF peak, wherein the numerical values of ΔT and ΔH having the following relationships:

$$\Delta T > -0.1299(\Delta H) + 62.81 \text{ for } \Delta H \text{ greater than zero and up to 130 J/g,}$$

$$\Delta T \geq 48° \text{ C. for } \Delta H \text{ greater than 130 J/g,}$$

wherein the CRYSTAF peak being determined using at least 5 percent of the cumulative polymer, and if less than 5 percent of the polymer having an identifiable CRYSTAF peak, then the CRYSTAF temperature being 30° C.; or (c) being characterized by an elastic recovery, Re, in percent at 300 percent strain and 1 cycle measured with a compression-molded film of the ethylene/α-olefin interpolymer, and having a density, d, in grams/cubic centimeter, wherein the numerical values of Re and d satisfying the following relationship when ethylene/α-olefin interpolymer being substantially free of a cross-linked phase:

$$Re > 1481 - 1629(d); \text{ or}$$

(d) having a molecular fraction which elutes between 40° C. and 130° C. when fractionated using TREF, characterized in that the fraction having a molar comonomer content of at least 5 percent higher than that of a comparable random ethylene interpolymer fraction eluting between the same temperatures, wherein said comparable random ethylene interpolymer having the same comonomer(s) and having a melt index, density, and molar comonomer content (based on the whole polymer) within 10 percent of that of the ethylene/α-olefin interpolymer; or (e) having a storage modulus at 25° C., G' (25° C.), and a storage modulus at 100° C., G' (100° C.), wherein the ratio of G' (25° C.) to G' (100° C.) being in the range of about 1:1 to about 9:1.

Such olefin block copolymer, e.g. ethylene/α-olefin interpolymer may also:

(a) have a molecular fraction which elutes between 40° C. and 130° C. when fractionated using TREF, characterized in that the fraction having a block index of at least 0.5 and up to about 1 and a molecular weight distribution, $M_w/M_n$, greater than about 1.3; or (b) have an average block index greater than zero and up to about 1.0 and a molecular weight distribution, $M_w/M_n$, greater than about 1.3.

In one embodiment, matrix (18) may further comprise a blowing agent thereby facilitating the formation a foam material. In one embodiment, the matrix may be a foam, for example a closed cell foam. In another embodiment, matrix (18) may further comprise one or more fillers thereby facilitating the formation a microporous matrix, for example, via orientation, e.g. biaxial orientation, or cavitation, e.g. uniaxial or biaxial orientation, or leaching, i.e. dissolving the fillers. Such fillers include, but are not limited to, natural calcium carbonates, including chalks, calcites and marbles, synthetic carbonates, salts of magnesium and calcium, dolomites, magnesium carbonate, zinc carbonate, lime, magnesia, barium sulphate, barite, calcium sulphate, silica, magnesium silicates, talc, wollastonite, clays and aluminum silicates, kaolins, mica, oxides or hydroxides of metals or alkaline earths, magnesium hydroxide, iron oxides, zinc oxide, glass or carbon fiber or powder, wood fiber or powder or mixtures of these compounds.

The one or more second thermoplastic materials (12) include, but are not limited to, polyolefin, e.g. polyethylene and polypropylene; polyamide, e.g. nylon 6; polyvinylidene chloride; polyvinylidene fluoride; polycarbonate; polystyrene; polyethylene terephthalate; polyurethane and polyester. The matrix (18) may be reinforced via, for example, via glass or carbon fibers and/or any other mineral fillers such talc or calcium carbonate. Exemplary fillers include, but are not limited to, natural calcium carbonates, including chalks, calcites and marbles, synthetic carbonates, salts of magnesium and calcium, dolomites, magnesium carbonate, zinc carbonate, lime, magnesia, barium sulphate, barite, calcium sulphate, silica, magnesium silicates, talc, wollastonite, clays and aluminum silicates, kaolins, mica, oxides or hydroxides of metals or alkaline earths, magnesium hydroxide, iron oxides, zinc oxide, glass or carbon fiber or powder, wood fiber or powder or mixtures of these compounds.

Examples of second thermoplastic materials (12) include, but are not limited to, homopolymers and copolymers (including elastomers) of one or more alpha-olefins such as ethylene, propylene, 1-butene, 3-methyl-1-butene, 4-methyl-1-pentene, 3-methyl-1-pentene, 1-heptene, 1-hexene, 1-octene, 1-decene, and 1-dodecene, as typically represented by polyethylene, polypropylene, poly-1-butene, poly-3-methyl-1-butene, poly-3-methyl-1-pentene, poly-4-methyl-1-pentene, ethylene-propylene copolymer, ethylene-1-butene copolymer, and propylene-1-butene copolymer; copolymers (including elastomers) of an alpha-olefin with a conjugated or non-conjugated diene, as typically represented by ethylene-butadiene copolymer and ethylene-ethylidene norbornene copolymer; and polyolefins (including elastomers) such as copolymers of two or more alpha-olefins with a conjugated or non-conjugated diene, as typically represented by ethylene-propylene-butadiene copolymer, ethylene-propylene-dicyclopentadiene copolymer, ethylene-propylene-1,5-hexadiene copolymer, and ethylene-propylene-ethylidene norbornene copolymer; ethylene-vinyl compound copolymers such as ethylene-vinyl acetate copolymer, ethylene-vinyl alcohol copolymer, ethylene-vinyl chloride copolymer, ethylene acrylic acid or ethylene-(meth) acrylic acid copolymers, and ethylene-(meth)acrylate copolymer; styrenic copolymers (including elastomers) such as polystyrene, ABS, acrylonitrile-styrene copolymer, α-methylstyrene-styrene copolymer, styrene vinyl alcohol, styrene acrylates such as styrene methylacrylate, styrene butyl acrylate, styrene butyl methacrylate, and styrene butadienes and crosslinked styrene polymers; and styrene block copolymers (including elastomers) such as styrene-butadiene copolymer and hydrate thereof, and styrene-isoprene-styrene triblock copolymer; polyvinyl compounds such as polyvinyl chloride, polyvinylidene chloride, vinyl chloride-vinylidene chloride copolymer, polyvinylidene fluoride, polymethyl acrylate, and polymethyl methacrylate; polyamides such as nylon 6, nylon 6,6, and nylon 12; thermoplastic polyesters such as polyethylene terephthalate and polybutylene terephthalate; polyurethane; polycarbonate, polyphenylene oxide, and the like; and glassy hydrocarbon-based resins, including poly-dicyclopentadiene polymers and related polymers (copolymers, terpolymers); saturated mono-olefins such as vinyl acetate, vinyl propionate, vinyl versatate, and vinyl butyrate and the like; vinyl esters such as esters of monocarboxylic acids, including methyl acrylate, ethyl acrylate, n-butyl acrylate, isobutyl acrylate, 2-ethylhexyl acrylate, dodecyl acrylate, n-octyl acrylate, phenyl acrylate, methyl methacrylate, ethyl methacrylate, and butyl methacrylate and the like; acrylonitrile, methacrylonitrile, acrylamide, mixtures thereof; resins produced by ring opening metathesis and cross metathesis polymerization and the like. These resins may be used either alone or in combinations of two or more.

In selected embodiments, the second thermoplastic material (12) may, for example, comprise one or more polyolefins selected from the group consisting of ethylene-alpha olefin copolymers, propylene-alpha olefin copolymers, and olefin block copolymers. In particular, in select embodiments, the second thermoplastic material (12) may comprise one or more non-polar polyolefins.

In specific embodiments, polyolefins such as polypropylene, polyethylene, copolymers thereof, and blends thereof, as well as ethylene-propylene-diene terpolymers, may be used. In some embodiments, exemplary olefinic polymers include homogeneous polymers; high density polyethylene (HDPE); heterogeneously branched linear low density polyethylene (LLDPE); heterogeneously branched ultra low linear density polyethylene (ULDPE); homogeneously branched, linear ethylene/alpha-olefin copolymers; homogeneously branched, substantially linear ethylene/alpha-olefin polymers; and high pressure, free radical polymerized ethylene polymers and copolymers such as low density polyethylene (LDPE) or ethylene vinyl acetate polymers (EVA).

In one embodiment, the ethylene-alpha olefin copolymer may, for example, be ethylene-butene, ethylene-hexene, or ethylene-octene copolymers or interpolymers. In other particular embodiments, the propylene-alpha olefin copolymer may, for example, be a propylene-ethylene or a propylene-ethylene-butene copolymer or interpolymer.

In certain other embodiments, the second thermoplastic material (12) may, for example, be a semi-crystalline polymer and may have a melting point of less than 110° C. In another embodiment, the melting point may be from 25 to 100° C. In another embodiment, the melting point may be between 40 and 85° C.

In one particular embodiment, the second thermoplastic material (12) is a propylene/α-olefin interpolymer composition comprising a propylene/alpha-olefin copolymer, and optionally one or more polymers, e.g. a random copolymer polypropylene (RCP). In one particular embodiment, the propylene/alpha-olefin copolymer is characterized as having substantially isotactic propylene sequences. "Substantially isotactic propylene sequences" means that the sequences have an isotactic triad (mm) measured by $^{13}$C NMR of greater than about 0.85; in the alternative, greater than about 0.90; in another alternative, greater than about 0.92; and in another alternative, greater than about 0.93. Isotactic triads are well-known in the art and are described in, for example, U.S. Pat. No. 5,504,172 and International Publication No. WO 00/01745, which refer to the isotactic sequence in terms of a triad unit in the copolymer molecular chain determined by $^{13}$C NMR spectra.

The propylene/alpha-olefin copolymer may have a melt flow rate in the range of from 0.1 to 500 g/10 minutes, measured in accordance with ASTM D-1238 (at 230° C./2.16 Kg). All individual values and subranges from 0.1 to 500 g/10 minutes are included herein and disclosed herein; for example, the melt flow rate can be from a lower limit of 0.1 g/10 minutes, 0.2 g/10 minutes, or 0.5 g/10 minutes to an upper limit of 500 g/10 minutes, 200 g/10 minutes, 100 g/10 minutes, or 25 g/10 minutes. For example, the propylene/alpha-olefin copolymer may have a melt flow rate in the range of from 0.1 to 200 g/10 minutes; or in the alternative, the propylene/alpha-olefin copolymer may have a melt flow rate in the range of from 0.2 to 100 g/10 minutes; or in the alternative, the propylene/alpha-olefin copolymer may have a melt flow rate in the range of from 0.2 to 50 g/10 minutes; or in the alternative, the propylene/alpha-olefin copolymer may have a melt flow rate in the range of from 0.5 to 50 g/10 minutes; or in the alternative, the propylene/alpha-olefin copolymer may have a melt flow rate in the range of from 1 to 50 g/10 minutes; or in the alternative, the propylene/alpha-olefin copolymer may have a melt flow rate in the range of from 1 to 40 g/10 minutes; or in the alternative, the propylene/alpha-olefin copolymer may have a melt flow rate in the range of from 1 to 30 g/10 minutes.

The propylene/alpha-olefin copolymer has a crystallinity in the range of from at least 1 percent by weight (a heat of fusion of at least 2 Joules/gram) to 30 percent by weight (a heat of fusion of less than 50 Joules/gram). All individual values and subranges from 1 percent by weight (a heat of fusion of at least 2 Joules/gram) to 30 percent by weight (a heat of fusion of less than 50 Joules/gram) are included herein and disclosed herein; for example, the crystallinity can be from a lower limit of 1 percent by weight (a heat of fusion of at least 2 Joules/gram), 2.5 percent (a heat of fusion of at least 4 Joules/gram), or 3 percent (a heat of fusion of at least 5 Joules/gram) to an upper limit of 30 percent by weight (a heat of fusion of less than 50 Joules/gram), 24 percent by weight (a heat of fusion of less than 40 Joules/gram), 15 percent by weight (a heat of fusion of less than 24.8 Joules/gram) or 7 percent by weight (a heat of fusion of less than 11 Joules/gram). For example, the propylene/alpha-olefin copolymer may have a crystallinity in the range of from at least 1 percent by weight (a heat of fusion of at least 2 Joules/gram) to 24 percent by weight (a heat of fusion of less than 40 Joules/gram); or in the alternative, the propylene/alpha-olefin copolymer may have a crystallinity in the range of from at least 1 percent by weight (a heat of fusion of at least 2 Joules/gram) to 15 percent by weight (a heat of fusion of less than 24.8 Joules/gram); or in the alternative, the propylene/alpha-olefin copolymer may have a crystallinity in the range of from at least 1 percent by weight (a heat of fusion of at least 2 Joules/gram) to 7 percent by weight (a heat of fusion of less than 11 Joules/gram); or in the alternative, the propylene/alpha-olefin copolymer may have a crystallinity in the range of from at least 1 percent by weight (a heat of fusion of at least 2 Joules/gram) to 5 percent by weight (a heat of fusion of less than 8.3 Joules/gram). The crystallinity is measured via DSC method. The propylene/alpha-olefin copolymer comprises units derived from propylene and polymeric units derived from one or more alpha-olefin comonomers. Exemplary comonomers utilized to manufacture the propylene/alpha-olefin copolymer are $C_2$, and $C_4$ to $C_{10}$ alpha-olefins; for example, $C_2$, $C_4$, $C_6$ and $C_8$ alpha-olefins.

The propylene/alpha-olefin copolymer comprises from 1 to 40 percent by weight of one or more alpha-olefin comonomers. All individual values and subranges from 1 to 40 weight percent are included herein and disclosed herein; for example, the comonomer content can be from a lower limit of 1 weight percent, 3 weight percent, 4 weight percent, 5 weight percent, 7 weight percent, or 9 weight percent to an upper limit of 40 weight percent, 35 weight percent, 30 weight percent, 27 weight percent, 20 weight percent, 15 weight percent, 12 weight percent, or 9 weight percent. For example, the propylene/alpha-olefin copolymer comprises from 1 to 35 percent by weight of one or more alpha-olefin comonomers; or in the alternative, the propylene/alpha-olefin copolymer comprises from 1 to 30 percent by weight of one or more alpha-olefin comonomers; or in the alternative, the propylene/alpha-olefin copolymer comprises from 3 to 27 percent by weight of one or more alpha-olefin comonomers; or in the alternative, the propylene/alpha-olefin copolymer comprises from 3 to 20 percent by weight of one or more alpha-olefin comonomers; or in the alternative, the propylene/alpha-olefin copolymer comprises from 3 to 15 percent by weight of one or more alpha-olefin comonomers.

The propylene/alpha-olefin copolymer has a molecular weight distribution (MWD), defined as weight average molecular weight divided by number average molecular weight ($M_w/M_n$) of 3.5 or less; in the alternative 3.0 or less; or in another alternative from 1.8 to 3.0.

Such propylene/alpha-olefin copolymers are further described in details in the U.S. Pat. Nos. 6,960,635 and 6,525,157, incorporated herein by reference. Such propylene/alpha-olefin copolymers are commercially available from The Dow Chemical Company, under the tradename VERSIFY™, or from ExxonMobil Chemical Company, under the tradename VISTAMAXX™.

In one embodiment, the propylene/alpha-olefin copolymers are further characterized as comprising (A) between 60 and less than 100, preferably between 80 and 99 and more preferably between 85 and 99, weight percent units derived from propylene, and (B) between greater than zero and 40, preferably between 1 and 20, more preferably between 4 and 16 and even more preferably between 4 and 15, weight percent units derived from at least one of ethylene and/or a $C_{4-10}$ α-olefin; and containing an average of at least 0.001, preferably an average of at least 0.005 and more preferably an average of at least 0.01, long chain branches/1000 total carbons. The maximum number of long chain branches in the propylene/alpha-olefin copolymer is not critical, but typically it does not exceed 3 long chain branches/1000 total carbons. The term long chain branch, as used herein with regard to propylene/alpha-olefin copolymers, refers to a chain length of at least one (1) carbon more than a short chain branch, and short chain branch, as used herein with regard to propylene/alpha-olefin copolymers, refers to a chain length of two (2) carbons less than the number of carbons in the comonomer. For example, a propylene/1-octene interpolymer has backbones with long chain branches of at least seven (7) carbons in length, but these backbones also have short chain branches of only six (6) carbons in length. Such propylene/alpha-olefin copolymers are further described in details in the U.S. Provisional Patent Application No. 60/988,999 and International Patent Application No. PCT/US08/082599, each of which is incorporated herein by reference.

In certain other embodiments, the second thermoplastic material 12, e.g. propylene/alpha-olefin copolymer, may, for example, be a semi-crystalline polymer and may have a melting point of less than 110° C. In preferred embodiments, the melting point may be from 25 to 100° C. In more preferred embodiments, the melting point may be between 40 and 85° C.

In other selected embodiments, olefin block copolymers, e.g., ethylene multi-block copolymer, such as those described in the International Publication No. WO2005/090427 and U.S. Patent Application Publication No. US 2006/0199930, incorporated herein by reference to the extent describing such olefin block copolymers and the test methods for measuring those properties listed below for such polymers, may be used as the second thermoplastic material (12). Such olefin block copolymer may be an ethylene/α-olefin interpolymer:

(a) having a $M_w/M_n$ from about 1.7 to about 3.5, at least one melting point, $T_m$, in degrees Celsius, and a density, d, in grams/cubic centimeter, wherein the numerical values of $T_m$ and d corresponding to the relationship:

$$T_m > -2002.9 + 4538.5(d) - 2422.2(d)^2; \text{ or}$$

(b) having a $M_w/M_n$ from about 1.7 to about 3.5, and being characterized by a heat of fusion, ΔH in J/g, and a delta quantity, ΔT, in degrees Celsius defined as the temperature difference between the tallest DSC peak and the tallest CRYSTAF peak, wherein the numerical values of ΔT and ΔH having the following relationships:

$\Delta T > -0.1299(\Delta H) + 62.81$ for $\Delta H$ greater than zero and up to 130 J/g, $\Delta T \geq 48°$ C. for $\Delta H$ greater than 130 J/g, wherein the CRYSTAF peak being determined using at least 5 percent of the cumulative polymer, and if less than 5 percent of the polymer having an identifiable CRYSTAF peak, then the CRYSTAF temperature being 30° C.; or (c) being characterized by an elastic recovery, Re, in percent at 300 percent strain and 1 cycle measured with a compression-molded film of the ethylene/α-olefin interpolymer, and having a density, d, in grams/cubic centimeter, wherein the numerical values of Re and d satisfying the following relationship when ethylene/α-olefin interpolymer being substantially free of a cross-linked phase:

$Re > 1481 - 1629(d)$; or (d) having a molecular fraction which elutes between 40° C. and 130° C. when fractionated using TREF, characterized in that the fraction having a molar comonomer content of at least 5 percent higher than that of a comparable random ethylene interpolymer fraction eluting between the same temperatures, wherein said comparable random ethylene interpolymer having the same comonomer(s) and having a melt index, density, and molar comonomer content (based on the whole polymer) within 10 percent of that of the ethylene/α-olefin interpolymer; or (e) having a storage modulus at 25° C., G' (25° C.), and a storage modulus at 100° C., G' (100° C.), wherein the ratio of G' (25° C.) to G' (100° C.) being in the range of about 1:1 to about 9:1.

Such olefin block copolymer, e.g. ethylene/α-olefin interpolymer may also:

(a) have a molecular fraction which elutes between 40° C. and 130° C. when fractionated using TREF, characterized in that the fraction having a block index of at least 0.5 and up to about 1 and a molecular weight distribution, $M_w/M_n$, greater than about 1.3; or (b) have an average block index greater than zero and up to about 1.0 and a molecular weight distribution, $M_w/M_n$, greater than about 1.3.

In one embodiment, the second thermoplastic material (12) may further comprise a blowing agent thereby facilitating the formation of a foam material. In one embodiment, the second thermoplastic material (12) may be formed into a foam, for example a closed cell foam. In another embodiment, the second thermoplastic material (12) may further comprise one or more fillers. Such fillers include, but are not limited to, natural calcium carbonates, including chalks, calcites and marbles, synthetic carbonates, salts of magnesium and calcium, dolomites, magnesium carbonate, zinc carbonate, lime, magnesia, barium sulphate, barite, calcium sulphate, silica, magnesium silicates, talc, wollastonite, clays and aluminum silicates, kaolins, mica, oxides or hydroxides of metals or alkaline earths, magnesium hydroxide, iron oxides, zinc oxide, glass or carbon fiber or powder, wood fiber or powder or mixtures of these compounds.

Figure 7A:
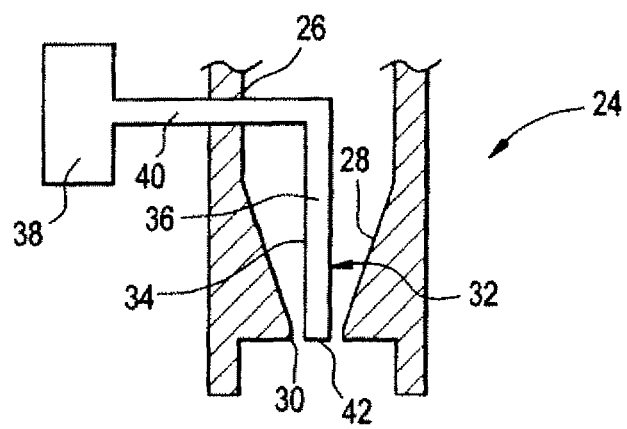
FIGS. 7a-b are schematic illustration of a microcapillary die.
Figure 7B:
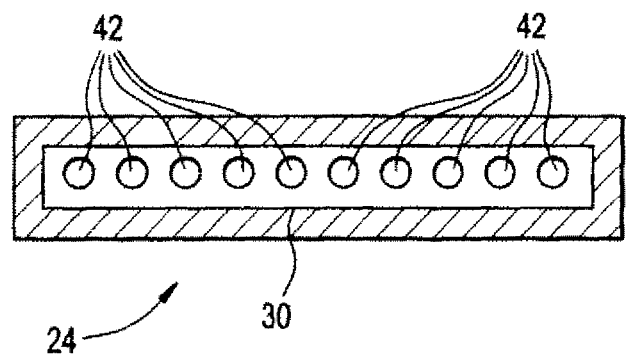

In production, the extrusion apparatus comprises screw extruder driven by a motor. First thermoplastic material (11) is melted and conveyed to a die (24), as shown in FIGS. 7a and 7b. The molten thermoplastic material (11) passes through die (24), as shown in FIGS. 7a and 7b, and is formed into the desired shape and cross section. Referring to FIGS. 7a and 7b, die 24 includes an entry portion (26), a convergent portion (28), and an orifice (30), which has a predetermined shape. The molten first thermoplastic material (11) enters entry portion (26) of the die (24), and is gradually shaped by the convergent portion (28) until the melt exits the orifice (30). The die (24) further includes injectors (32). Each injector (32) has a body portion (34) having a conduit (36) therein which is fluidly connected to a second thermoplastic material (12) source (38) by means of second conduit (40) passing through the walls of die (24) around which the molten first thermoplastic material (11) must flow to pass the orifice (30). The injector (30) further includes an outlet (42). The injector (32) is arranged such that the outlet (42) is located within the orifice (30). As the molten first thermoplastic material (11) exits the die orifice (30), molten second thermoplastic material (12) is coextruded and injected into the molten first thermoplastic material (11) thereby forming microcapillaries filled with the second thermoplastic material (12). In one embodiment, the molten first thermoplastic material (11) exits the die orifice (30), molten second thermoplastic material (12) is continuously coextruded and injected into the molten first thermoplastic material (11) thereby forming microcapillaries filled with the second thermoplastic material (12). In another embodiment, the molten first thermoplastic material (11) exits the die orifice (30), molten second thermoplastic material (12) is intermittently coextruded and injected into the molten first thermoplastic material (11) thereby forming microcapillaries filled with the second thermoplastic material (12) segments and void segments exhibiting foam like structures.

The reinforced films or foams according to the present invention may be used in packaging (e.g. reinforced thermoformed parts for trays, tape wrap, buckets, beakers, boxes); thermoformed boat hulls, building panels, seating devices, automotive body parts, fuselage parts, vehicle interior trim, and the like.

One or more inventive reinforced films or foams may form one or more layers in a multilayer structure, for example, a laminated multilayer structure or a coextruded multilayer structure. The reinforced films or foams may comprise one or more parallel rows of microcapillaries (channels as shown in FIG. 3). Channels 20 (microcapillaries) may be disposed any where in matrix (10), as shown in FIGS. 3.

Examples

Inventive reinforced film 1 was prepared according to the following process.

The matrix material comprised linear low density polyethylene (LLDPE), available under the tradename DOWLEX™ NG 5056 G from The Dow Chemical Company, having a density of approximately 0.919 g/cm³, according to ASTM-D792 and a melt index ($I_2$) of approximately 1.1 g/10 minutes, according to ISO 1133 at 190° C. and 2.16 kg. The second thermoplastic material disposed in microcapillaries was homopolymer polypropylene (hPP), available under the tradename DOW™ Polypropylene H502-25RG from The Dow Chemical Company, having a density of 0.900 g/cm³ according to ISO 1183 and a melt mass-flow rate of 25 g/10 minutes, measured according to ISO 1133 at 230° C. and 2.16 kg.

Primary and secondary extruders were both single screw extruders. The primary extruder was a Betol 1820J having a screw approximately 20 mm in diameter, which was connected to a gear pump, providing a non-pulstile polymer flow. Downstream of the microcapillary film die was a set of nip rollers with an adjustable roller gap (Dr. Collin GmbH "Techline" CR72T). The secondary extruder was Betol 1420J having a screw of approximately 12 mm in diameter, which was connected to the inlet of the microcapillary film die via a heated, quarter inch, Swagelok tubing. The tubing was a short length of carefully shaped, quarter inch, tubing (SS-T4-S-049-6ME) that was wrapped in two 2 foot, heating tapes (Omega HTWC102-002), which was wrapped in a Superwool mineral wool insulation that was encapsulated in masking tape. The tubing included k-type wire thermocouples, attached to tubes surface with 3M polyamide tape (3M 70-0062-8328-0). A small amount of copper grease (Coppaslip) was smeared onto the tips of the thermocouples to assist heat transfer.

The microcapillary film die was engineered to ensure that the open faces of the injectors were coincident with the die exit. Matrix material was extruded through a microcapillary film die containing a 14 microcapillary injector heads, having a diameter of approximately 900 μm.

Figure 8A:
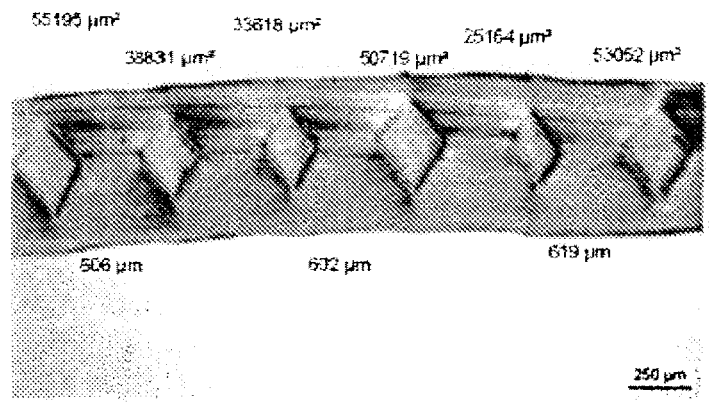
FIGS. 8a-b are photographs of cross-sectional views of the inventive reinforced microcapillary film 1.
Figure 8B:
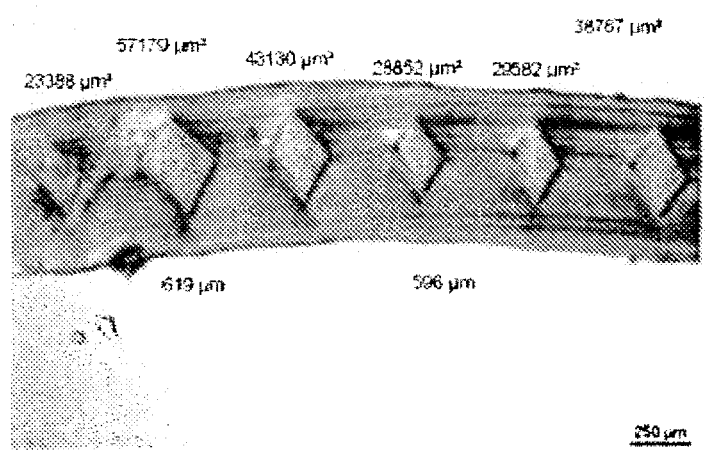

Inventive reinforced microcapillary film (10) (LLDPE/hPP) is shown in FIGS. 8a and b. The inventive reinforced microcapillary film (10) (LLDPE/hPP) was tested for its properties, and these properties are reported in Table 1. The inventive reinforced microcapillary film (10) (LLDPE/hPP) had 14 microcapillaries filed with second hPP, a thickness of approximately 608 μm, and each microcapillary had a diameter of approximately 360 μm.

Inventive reinforced film 2 was prepared according to the following process.

The matrix material comprised homopolymer polypropylene (hPP), available under the tradename DOW™ Polypropylene H502-25RG from The Dow Chemical Company, having a density of 0.900 g/cm$^3$ according to ISO 1183 and a melt mass-flow rate of 25 g/10 minutes, measured according to ISO 1133 at 230° C. and 2.16 kg. The second thermoplastic material disposed in microcapillaries was linear low density polyethylene (LLDPE), available under the tradename DOWLEX™ NG 5056 G from The Dow Chemical Company, having a density of approximately 0.919 g/cm3, according to ASTM-D792 and a melt index ($I_2$) of approximately 1.1 g/10 minutes, according to ISO 1133 at 190° C. and 2.16 kg.

Primary and secondary extruders were both single screw extruders. The primary extruder was a Betol 1820J having a screw approximately 20 mm in diameter, which was connected to a gear pump, providing a non-pulstile polymer flow. Downstream of the microcapillary film die was a set of nip rollers with an adjustable roller gap (Dr. Collin GmbH "Techline" CR72T). The secondary extruder was Betol 1420J having a screw of approximately 12 mm in diameter, which was connected to the inlet of the microcapillary film die via a heated, quarter inch, Swagelok tubing. The tubing was a short length of carefully shaped, quarter inch, tubing (SS-T4-S-049-6ME) that was wrapped in two 2 foot, heating tapes (Omega HTWC102-002), which was wrapped in a Superwool mineral wool insulation that was encapsulated in masking tape. The tubing included k-type wire thermocouples, attached to tubes surface with 3M polyamide tape (3M 70-0062-8328-0). A small amount of copper grease (Coppaslip) was smeared onto the tips of the thermocouples to assist heat transfer.

The microcapillary film die was engineered to ensure that the open faces of the injectors were coincident with the die exit. Matrix material was extruded through a microcapillary film die containing a 14 microcapillary injector heads, having a diameter of approximately 900 μm.

Figure 9A:
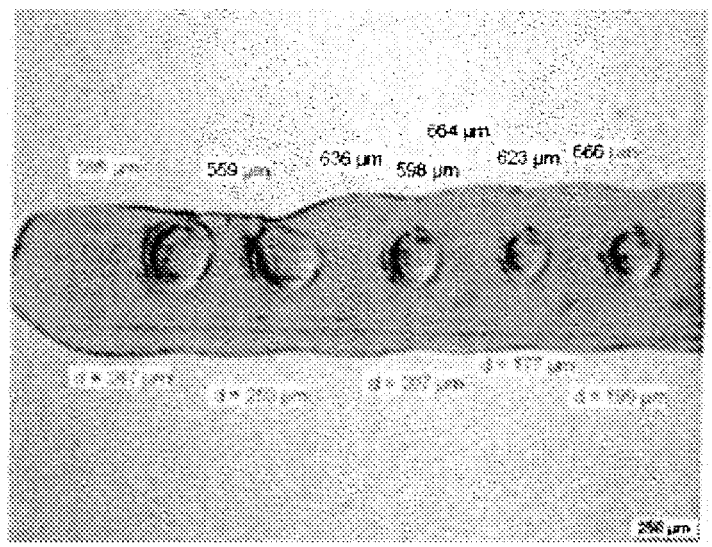
FIGS. 9a-c are photographs of cross-sectional views of the inventive reinforced microcapillary film 2.
Figure 9B:
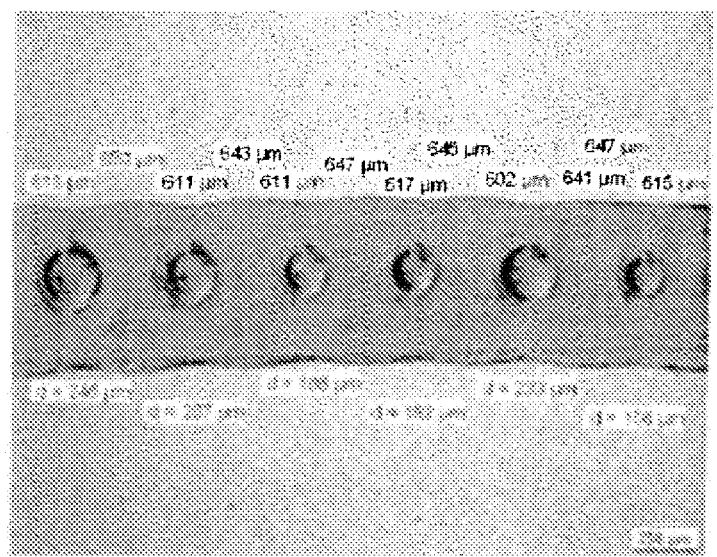
Figure 9C:
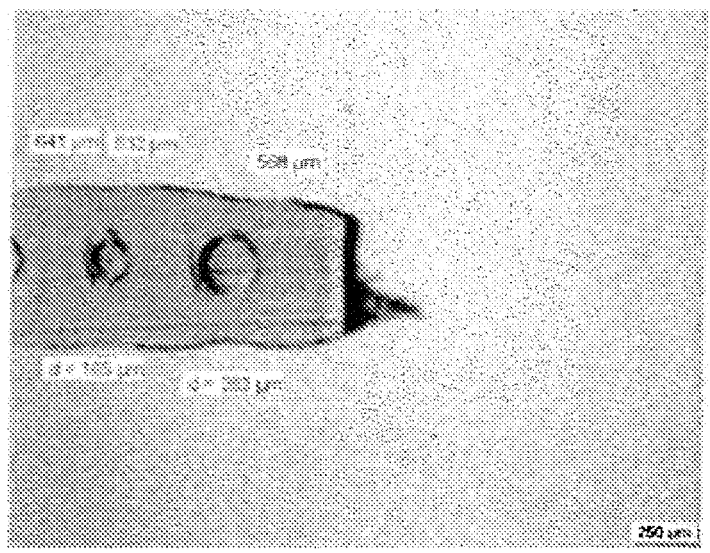

Inventive reinforced microcapillary film 10 (hPP/LLDPE) is shown in FIGS. 9a-c. The inventive reinforced microcapillary film 10 (hPP/LLDPE) had 14 microcapillaries filed with second LLDPE, a thickness of approximately 624 μm, and each microcapillary had a diameter of approximately 210 μm.

Comparative film A was prepared according to the following process.

The comparative film A comprised linear low density polyethylene (LLDPE), available under the tradename DOWLEX™ NG 5056 G from The Dow Chemical Company, having a density of approximately 0.919 g/cm3, according to ASTM-D792 and a melt index ($I_2$) of approximately 1.1 g/10 minutes, according to ISO 1133 at 190° C. and 2.16 kg. The comparative film A was formed via a Betol 1820J extruder having a screw approximately 20 mm in diameter, which was connected to a gear pump, providing a non-pulstile polymer flow. Downstream of the microcapillary film die was a set of nip rollers with an adjustable roller gap (Dr. Collin GmbH "Techline" CR72T). The die did not include injector insert.

Figure 10A:
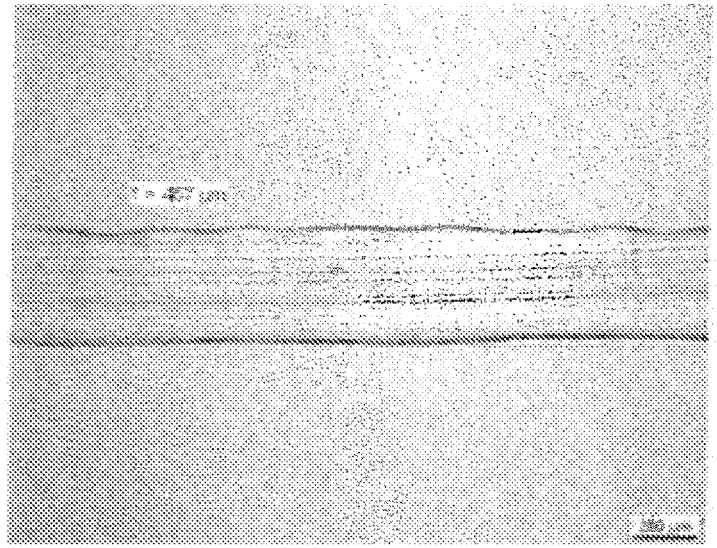
FIGS. 10a-b are photographs of cross-sectional views of the comparative film A.
Figure 10B:
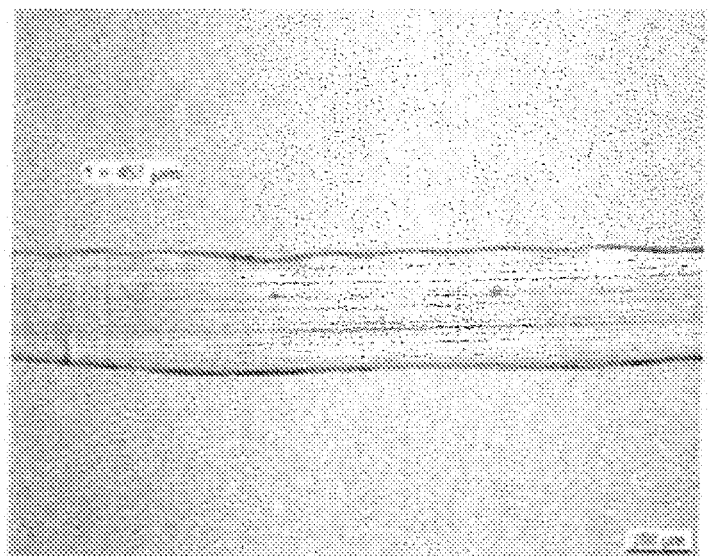

The comparative film A (LLDPE), shown in FIGS. 10a-b, was tested for its properties, and these properties are reported in Table 1. The comparative film A (LLDPE) had a thickness of approximately 457 μm, and no microcapillaries.

Comparative film B was prepared according to the following process.

The matrix material comprised linear low density polyethylene (LLDPE), available under the tradename DOWLEX™ NG 5056 G from The Dow Chemical Company, having a density of approximately 0.919 g/cm3, according to ASTM-D792 and a melt index ($I_2$) of approximately 1.1 g/10 minutes, according to ISO 1133 at 190° C. and 2.16 kg.

The comparative film B was formed via a Betol 1820J extruder having a screw approximately 20 mm in diameter, which was connected to a gear pump, providing a non-pulstile polymer flow. Downstream of the microcapillary film die was a set of nip rollers with an adjustable roller gap (Dr. Collin GmbH "Techline" CR72T).

The microcapillary film die, which included the injector insert, was engineered to ensure that the open faces of the injectors were coincident with the die exit. Matrix material was extruded through a microcapillary film die containing a 19 microcapillary injector heads, having a diameter of approximately 400 μm.

Figure 11:
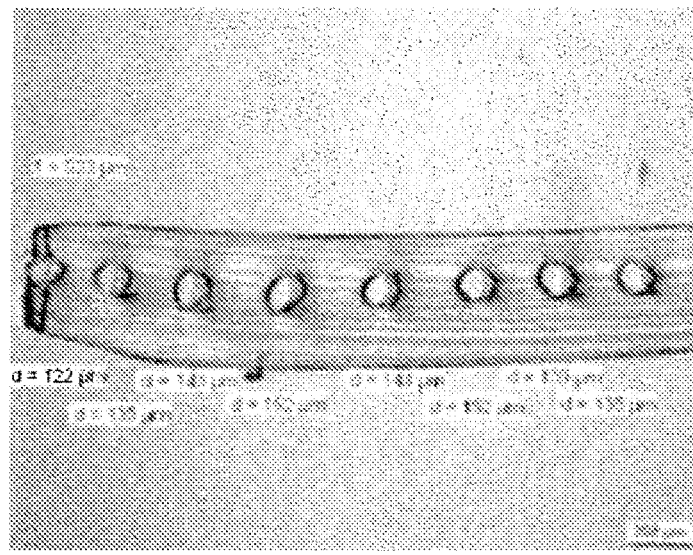
FIG. 11 is a photograph of cross-sectional view of the comparative film B.

Comparative film B (LLDPE/Air) is shown in FIG. 11. The Comparative film B (LLDPE/Air) was tested for its properties, and these properties are reported in Table 1. The comparative film B (LLDPE/Air) had 19 microcapillaries filed with air, a thickness of approximately 519 μm, and each microcapillary had a diameter of approximately 145 μm.

Comparative film C was prepared according to the following process.

The matrix material comprised (1) 97.5 percent by weight of linear low density polyethylene (LLDPE), available under the tradename DOWLEX™ NG 5056 G from The Dow Chemical Company, having a density of approximately 0.919 g/cm3, according to ASTM-D792 and a melt index ($I_2$) of approximately 1.1 g/10 minutes, according to ISO 1133 at 190° C. and 2.16 kg; and (2) 2.5 percent by weight of LDPE/TiO$_2$ masterbatch (comprising 60 percent by weight of TiO$_2$).

The comparative film C was formed via a Betol 1820J extruder having a screw approximately 20 mm in diameter, which was connected to a gear pump, providing a non-pulstile polymer flow. Downstream of the microcapillary film die was a set of nip rollers with an adjustable roller gap (Dr. Collin GmbH "Techline" CR72T).

The microcapillary film die, which included the injector insert, was engineered to ensure that the open faces of the injectors were coincident with the die exit. Matrix material was extruded through a microcapillary film die containing a 19 microcapillary injector heads, having a diameter of approximately 400 µm.

Figure 12A:
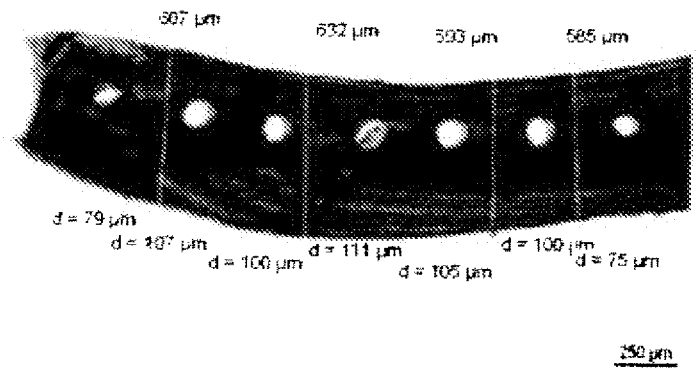
FIGS. 12a-c are photographs of cross-sectional views of the comparative film C.
Figure 12B:
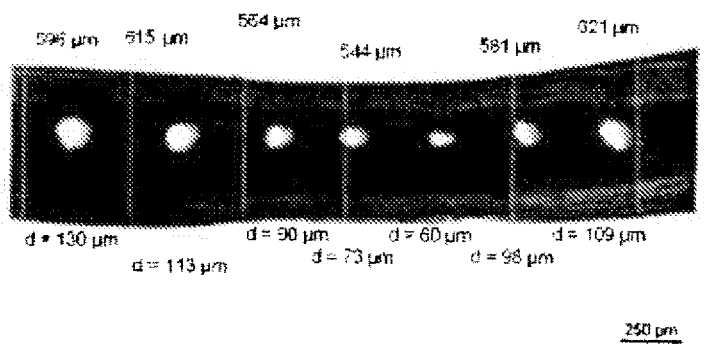
Figure 12C:
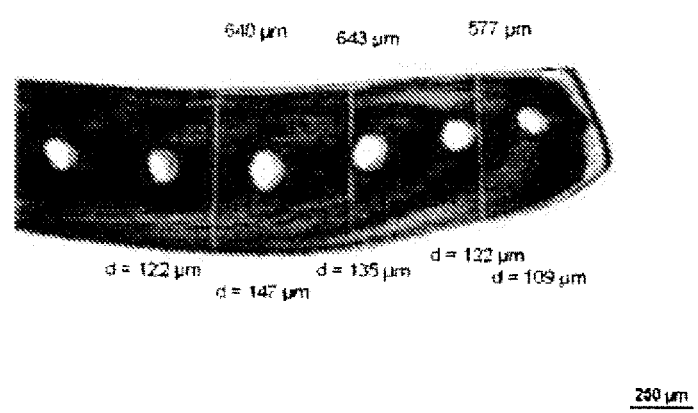

Comparative film C (LLDPE+ LDPE/TiO$_2$ Masterbatch/Air) is shown in FIGS. 12a-c. The Comparative film C (LLDPE+ LDPE/TiO$_2$ Masterbatch/Air) was tested for its properties, and these properties are reported in Table 1. The comparative film C (LLDPE+ LDPE/TiO$_2$ Masterbatch/Air) had 19 microcapillaries filed with air, a thickness of approximately 602 µm, and each microcapillary had a diameter of approximately 105 µm.

The present invention may be embodied in other forms without departing from the spirit and the essential attributes thereof, and, accordingly, reference should be made to the appended claims, rather than to the foregoing specification, as indicating the scope of the invention.

TABLE 1

| | Test Method | Inventive Reinforced Film 1 | Comparative Film A | Comparative Film B | Comparative Film C |
|---|---|---|---|---|---|
| Percent Elongation (%) | ISO 527-3 | 789 | 714 | 716 | 684 |
| Yield Stress (MPa) | ISO 527-3 | 11.3 | 6.5 | 6.9 | 8.5 |
| Toughness (MJ/m$^3$) | ISO 527-3 | 132 | 93 | 95 | 95 |
| Test Specimen (width in mm) | — | Tape/film (6.52 mm) | Tape/film (6.32 mm) | Tape/film (6.50 mm) | Tape/film (7.30 mm) |

We claim:

1. A reinforced foam having a first end and a second end, wherein said foam comprises:
   (a) a matrix comprising a first closed cell foam comprising a first thermoplastic material,
   (b) at least one or more channels disposed in parallel in said matrix from the first end to the second end of said foam, wherein said one or more channels are at least 1 µm apart from each other, wherein said one or more channels have a cross sectional shape selected from the group consisting of circular, rectangular, star, diamond, triangular, square, and combinations thereof, and wherein each said one or more channels have a diameter in the range of from 2 µm to 1998 µm; and
   (c) a second closed cell foam disposed in said one or more channels, wherein said second closed cell foam comprises a second thermoplastic material that is different than the first thermoplastic material;
   wherein said reinforced foam has a thickness such that the reinforced foam thickness to channel diameter ratio is in the range of from 2:1 to 400:1.

2. The reinforced foam of claim 1, wherein said first thermoplastic material is selected from the group consisting of polyolefin; polyamide; polyvinylidene chloride; polyvinylidene fluoride; polycarbonate; polystyrene; polyethylene vinylalcohol (PVOH), polyvinyl chloride, polylactic acid (PLA) and polyethylene terephthalate.

3. The reinforced foam of claim 2, wherein said polyolefin is polyethylene or polypropylene.

4. The reinforced foam of claim 2, wherein said polyamide is nylon 6.

5. The reinforced foam of claim 1, where said second thermoplastic material is selected from the group consisting of polyolefin; polyamide; polyvinylidene chloride; polyvinylidene fluoride; polycarbonate; polystyrene; polyethylene vinyl alcohol (PVOH), polyvinyl chloride, polylactic acid (PLA) and polyethylene terephthalate.

6. A multilayer structure comprising the reinforced foam of claim 1.

7. An article comprising the reinforced foam of claim 1.

* * * * *